(12) United States Patent
Toda et al.

(10) Patent No.: US 6,652,069 B2
(45) Date of Patent: Nov. 25, 2003

(54) METHOD OF SURFACE TREATMENT, DEVICE OF SURFACE TREATMENT, AND HEAD FOR USE IN INK JET PRINTER

(75) Inventors: Yoshiro Toda, Tokyo (JP); Kazuhiro Fukuda, Tokyo (JP); Akira Nishiwaki, Tokyo (JP)

(73) Assignee: Konica Corporation, Tokyo (JP)

( * ) Notice: Subject to any disclaimer, the term of this patent is extended or adjusted under 35 U.S.C. 154(b) by 62 days.

(21) Appl. No.: 10/000,888

(22) Filed: Nov. 15, 2001

(65) Prior Publication Data

US 2002/0097295 A1 Jul. 25, 2002

(30) Foreign Application Priority Data

Nov. 22, 2000 (JP) .......................................... 2000-355619
Nov. 24, 2000 (JP) .......................................... 2000-357534

(51) Int. Cl.[7] ................................................ B41J 2/135
(52) U.S. Cl. ...................................................... 347/45
(58) Field of Search ............................. 347/40, 44, 45, 347/46, 47, 68; 428/446, 469, 472, 698; 427/577, 578, 579, 249

(56) References Cited

U.S. PATENT DOCUMENTS

| 5,148,193 A | * | 9/1992 | Inamoto et al. ................ 347/45 |
| 5,300,951 A | * | 4/1994 | Yamazaki ..................... 346/1.1 |
| 5,581,285 A | * | 12/1996 | Watanabe et al. ............. 347/45 |
| 5,703,630 A | * | 12/1997 | Murakami et al. ............ 347/45 |

* cited by examiner

Primary Examiner—Stephen D. Meier
Assistant Examiner—An H. Do
(74) Attorney, Agent, or Firm—Frishauf, Holtz, Goodman & Chick, P.C.

(57) ABSTRACT

In a surface treatment for treating a surface of a subject of treating by a discharge-activated gas, under an atmospheric pressure or a pressure in the neighborhood of it, by arranging a second electrode at a position separated from the discharging section for generating said discharge-activated gas by a first electrode coated with a dielectric substance, and arranging a surface to be treated of a subject of treating between said plasma generating part, serving as a discharging section, and said second electrode, a surface treatment of said subject of treating is practiced.

23 Claims, 14 Drawing Sheets

METHOD OF SURFACE TREATMENT, DEVICE OF SURFACE TREATMENT, AND HEAD FOR USE IN INK JET PRINTER

BACKGROUND OF THE INVENTION

This invention relates to a surface treatment technology for practicing etching, ashing, reforming, and formation of a thin film for a surface of a subject of treating whose surface is difficult to treat for the reason such that it is placed at a separated position, or it has a complex shape, or for a surface of the inside of a vacant space in a subject of treating having a minute vacant-space structure.

Up to now, as a method of surface treatment, surface treatment by plasma discharge has been known. Usually, the surface treatment by plasma discharge has been practiced in vacuum or in an environment of a reduced pressure; however, in recent years, it has become possible a treatment in an atmospheric pressure or in a pressure in the neighborhood of it.

For example, such a technology is disclosed in the publications of the examined patent applications H2-48626, H4-74372, H6-72308, and H7-48480, and in the publications of the unexamined patent applications H2-281734, H3-229886, H3-236475, etc.

Now, in one of the most orthodox conventional methods of treatment, a subject of treating is exposed to a gas, which is caused to have activated species by a discharge (hereinafter referred to as a discharge-activated gas for simplicity) in the inner part of the discharging space. In this case, this method does not cope with a surface treatment for a subject of treating positioned apart from the discharging space. Further, for example, if a subject of treating having minute vacant spaces itself is placed between the electrodes and treated, the outer surface of the subject can be treated but the inside of the minute vacant spaces can not be treated because nearly no plasma is generated there, or the efficiency of treatment has been extremely low and very long treatment time has been necessary (refer to FIG. 10).

On the other hand, in recent years, for a method of treating only a specified part of a subject of treating, a plasma treatment method of a blowing-out type, in which excited active species of the discharge-activated gas generated by a plasma discharge under an atmospheric pressure is blown to the desired treating area only, has been found out. For example, the publications of the unexamined patent applications H3-219082 (by Yukiko Okazaki et al.), H6-2149, H4-358076, H9-232293, H11-251304, H11-260597, H11-335868, etc. can be cited.

In such a conventional technology as described in the above, in a conventional atmospheric plasma of a blowing-out type, the contact of a subject of treating with the excited active species is dominated by the uncontrolled gas flow depending on the amount of flow of the gas, gas tubing path, etc.; therefore, there have been a problem in the case of a treatment at a low amount of gas flowing, a problem such that a treating part having a complex shape, a treating part positioned apart from the blowing-out opening, or a treating part with which no gas jet collides cannot be treated efficiently, or selectively, etc.

However, because a method of an atmospheric plasma of a blowing-out type is a method to practice a treatment by bringing excited active species (radicals, ions, etc.) generated in a plasma generating space into contact with a portion to be treated, the inactivation of the excited active species influences the effect of the treatment remarkably for the reason of its principle. That is, the larger the distance between the plasma generating space and the subject of treating is, the more remarkably the effect of reforming is reduced; further, in the case where the vacant-space structure is minute or complex, the excited active species become difficult to enter further inside, which causes the effect of reforming to be almost lost.

SUMMARY OF THE INVENTION

It is an object of this invention, to treat portions positioned apart from the blowing-out opening for a discharge-activated gas without producing unevenness in a surface treatment of a subject of treating using a discharge-activated gas. It is another object of this invention to make it possible to treat, for example, a subject of treating having a complex shape. Further objects of this invention are to improve the efficiency of treatment by a large margin, to make it possible to shorten the treatment time or to lower the discharge output, and further, to make it possible to lower the damage of the subject of treating by the treatment, and as the result, to make possible a remarkable improvement of productivity, to state it concretely, to make possible a high-speed treatment, cost reduction by energy saving and by making running cost lower, and a high-quality surface treatment. Further objects of this invention are to manufacture a head for use in an ink jet printer by using this method of surface treatment, and to provide a device of surface treatment for it.

Accordingly, to overcome the cited shortcomings, the abovementioned objects of the present invention can be attained by methods and apparatus for treating a surface of a subject described as follow.

(1) A method for treating a surface of a subject to be processed under a surface treatment with a discharge-activated gas, comprising the steps of: generating the discharge-activated gas under substantially an atmospheric pressure at a discharging section, which comprises a first electrode coated with a first dielectric substance; placing the surface of the subject between an outlet of the discharging section and a second electrode disposed at a position separating from the discharging section; and treating the surface of the subject with the discharge-activated gas flowing from the outlet of the discharging section.

(2) The method of item 1, wherein the second electrode is grounded.

(3) The method of item 1, wherein a second dielectric substance is either coated or placed on a surface of the second electrode.

(4) The method of item 1, wherein the surface of the subject is coated with a high polymer material.

(5) The method of item 1, wherein the second electrode is disposed at such a position that the subject contact the second electrode either directly or indirectly.

(6) The method of item 1, wherein the second electrode is disposed in such a direction that the discharge-activated gas flows after the surface of the subject is treated.

(7) The method of item 1, wherein an electronic potential gradient is created along a flowing direction of the discharge-activated gas.

(8) The method of item 1, wherein the discharging section further comprises a third electrode disposed opposite the first electrode.

(9) The method of item 1, wherein the discharge-activated gas includes either a helium gas or an argon gas.

(10) The method of item 1, wherein the generating step further comprises the steps of: introducing a dischargeable gas into a discharging space of the discharging section from an inlet located at a side of the discharging section; applying an electronic potential onto the first electrode so that the discharge-activated gas is generated by discharging actions performed in the discharging space filled with the dischargeable gas; and gushing the discharge-activated gas from the outlet located another side of the discharging section through the discharging space.

(11) The method of item 1, wherein the subject comprises at least two openings including a first opening and a second opening, and the discharging section is set at the first opening, while the second electrode is set at the second opening.

(12) The method of item 11, wherein an interior surface of the subject is processed under the surface treatment.

(13) The method of item 11, wherein the first opening is an intake section of the discharge-activated gas, and the second electrode is an exhaust section of the discharge-activated gas.

(14) The method of item 11, wherein the first electrode is disposed at such a position that the first electrode contacts at least a part of an outer surface of a dischargeable-gas intake tube.

(15) The method of item 12, wherein the subject is an ink-jetting head, and the interior surface is a surface of an ink-flowing path fabricated in the ink-jetting head.

(16) The method of item 15, wherein the ink-jetting head comprises a piezoelectric element.

(17) The method of item 15, wherein the interior surface of the subject is treated by the discharge-activated gas so as to make the interior surface hydrophilic.

(18) The method of item 8, wherein discharging actions is performed in a gap between the first electrode and the third electrode and a distance between them is not greater than 50 mm.

(19) The method of item 1, wherein the surface of the subject is treated by the discharge-activated gas so as to make the surface hydrophilic.

(20) The method of item 1, wherein the surface of the subject is treated by the discharge-activated gas so as to form a thin film layer on the surface.

(21) The method of item 1, wherein the surface of the subject is treated by the discharge-activated gas so as to make the surface hydrophobic.

(22) The method of item 1, wherein the surface of the subject is treated by the discharge-activated gas so as to make the surface coarse.

(23) An ink-jetting head employed for an ink-jet printer, comprising: a base body; and an ink-flowing path formed in the base body; wherein an interior surface of the ink-flowing path is treated so as to make the interior surface hydrophilic, according to a method for treating the interior surface with a discharge-activated gas, comprising the steps of: generating the discharge-activated gas under substantially an atmospheric pressure at a discharging section, which comprises a first electrode coated with a first dielectric substance; placing the interior surface between an outlet of the discharging section and a second electrode disposed at a position separating from the discharging section; and treating the interior surface with the discharge-activated gas flowing from the outlet of the discharging section.

(24) An apparatus for treating a surface of a subject to be processed under a surface treatment with a discharge-activated gas, comprising: a discharging section, having a first electrode coated with a first dielectric substance, to generate the discharge-activated gas; a second electrode, disposed at a position separating from the discharging section, to guide the discharge-activated gas along an electronic potential gradient created by the second electrode.

BRIEF DESCRIPTION OF THE DRAWINGS

Other objects and advantages of the present invention will become apparent upon reading the following detailed description and upon reference to the drawings in which.

DETAILED DESCRIPTION OF THE PREFERRED EMBODIMENT

Figure 1:
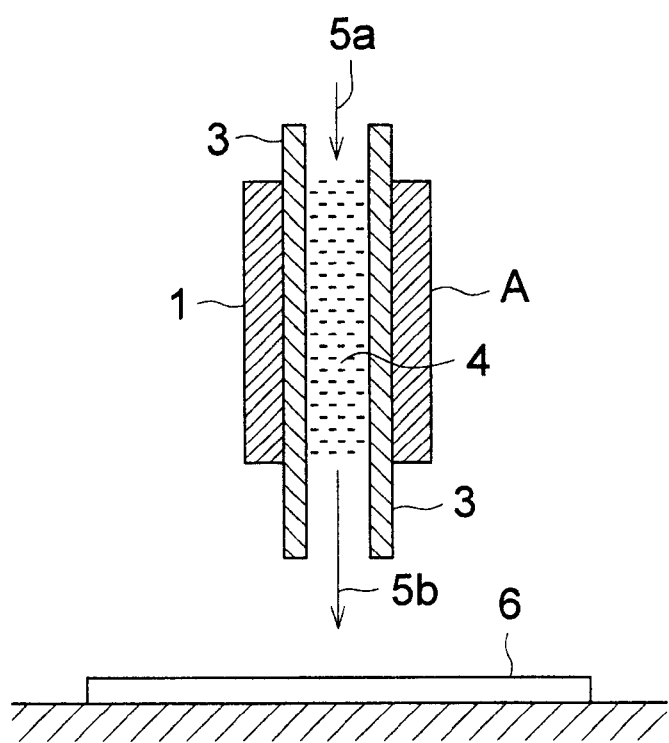
FIG. 1 is a drawing showing an example of the embodiment of a device for discharge treatment of a parallel-plate type for use in a method of surface treatment of this invention.

In the following, this invention will be explained in detail.

According to this invention, in a method of surface treatment of a subject of treating using a discharge-activated gas, by arranging a grounded electrode B (refer to FIG. 5 to FIG. 8) in such a way that said subject of treating is kept in direct or indirect contact with it, or by arranging said grounded electrode B at a position toward which said discharge-activated gas flows after the surface treatment of said subject of treating, it has become possible to apply a surface treatment without producing unevenness, for example, to a subject of treating placed at a position separated from the blowing-out opening of the discharge-activated gas or to a subject of treating having a complex shape, which has heretofore been regarded as difficult for a conventional method of surface treatment.

Not only that, but also it has become possible to accomplish the improvement of the efficiency of treatment by a large margin, and owing to this, it has become possible to shorten the treatment time or to reduce discharge output; further, also it has become possible to reduce the damage of the base substance of the surface of the subject of treating owing to excessive discharging, for example.

Further, by using a method of surface treatment of this invention, the improvement of the productivity of a surface treatment of a subject of treating by a large margin can be achieved; to state it concretely, to reduce cost by making the treatment speed high, energy saving, and making running cost lower, and to perform a high-quality surface treatment have become possible.

With respect to the reason why it has become possible to obtain the effects described in the specification of this invention by providing the grounded electrode B described in the above, the inventors presume that, because microdischarging occurs between said newly arranged grounded electrode B and the aforesaid high-voltage electrode at the time of discharging in said discharging space, a surface treatment of a subject of treating positioned apart from the blowing-out opening of the discharge-activated gas, or a surface treatment of a subject of treating having a special shape can be performed without producing unevenness, and on top of it, the undesired damage of the surface of a subject of treating owing to excessive discharging is reduced.

The electrodes, which are used in a method of surface treatment of this invention, will be explained.

For the electrodes to be used in a method of surface treatment of this invention, usually a metal such as a stainless steel, aluminum, copper, or silver is used, and the shape of the electrode may be planar, cylindrical, or rod-shaped. For the purpose of raising the efficiency of discharge and inducing a discharge stably, or for the purpose of preventing the deterioration of the electrode, one having an insulator (dielectric substance) provided on the surface is used as the electrode.

For a dielectric substance (an insulator for covering) to be used in a discharge electrode (for example, the high-voltage electrode, and the grounded electrode A positioned opposite to it/refer to FIG. 5 to FIG. 8), a substance having a high dielectric constant and a high thermal conductivity is desirable, and it is not particularly limited so long as it is a solid dielectric substance based on an insulator such as a high molecular resin (a polyimide resin, a polyester resin, or the like), a glass, a ceramic, and mica. For the thickness of the dielectric substance, it is appropriate to make it thinner in accordance with the frequency of the electric power source; for the thickness of the dielectric substance on the high-voltage electrode, 5 mm or under is suitable, and 0.1 to 2 mm is more desirable. Further, for the thickness of the dielectric substance on the grounded electrode A, 2 mm or under is desirable, and further, 0.1 mm to 1 mm is more desirable. For the thermal conductivity (efficiency of cooling) and the dielectric constant, the higher they are, the more desirable the substance is; from that view point, a ceramic or a composite material of a ceramic and a glass is particularly desirable. In the case of a ceramic, because closeness is necessary, a sintered material is most desirable, and in the case where a ceramic coating, which is not sintered such as a ceramic coating formed by spraying, is employed, it is desirable to apply a hole-filling treatment with an inorganic substance or an inorganic substance partly including an organic substance.

Further, from the view point of obtaining the effects described in the specification of this invention, it is desirable that, also for the grounded electrode A described in claim 1, a dielectric substance is coated on it or is arranged at it. For the thickness of the dielectric substance on the grounded electrode A, 2 mm or under is desirable, and 0.1 mm to 1 mm is more desirable.

By using FIG. 1 to FIG. 4, it will be explained examples of the high-voltage electrode for use in a device for discharge treatment to be used in generating a discharge-activated gas in this invention and the grounded electrode A.

Figure 2:
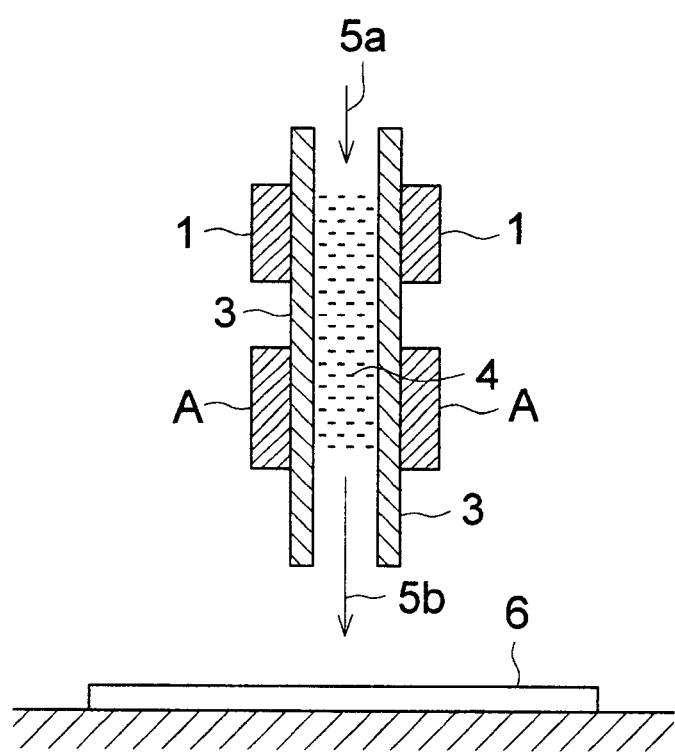
FIG. 2 is a drawing showing an example of the embodiment of a device for discharge treatment of a band type having a high-voltage electrode arranged in the discharge-activated gas generating space for use in a method of surface treatment of this invention.
Figure 3:
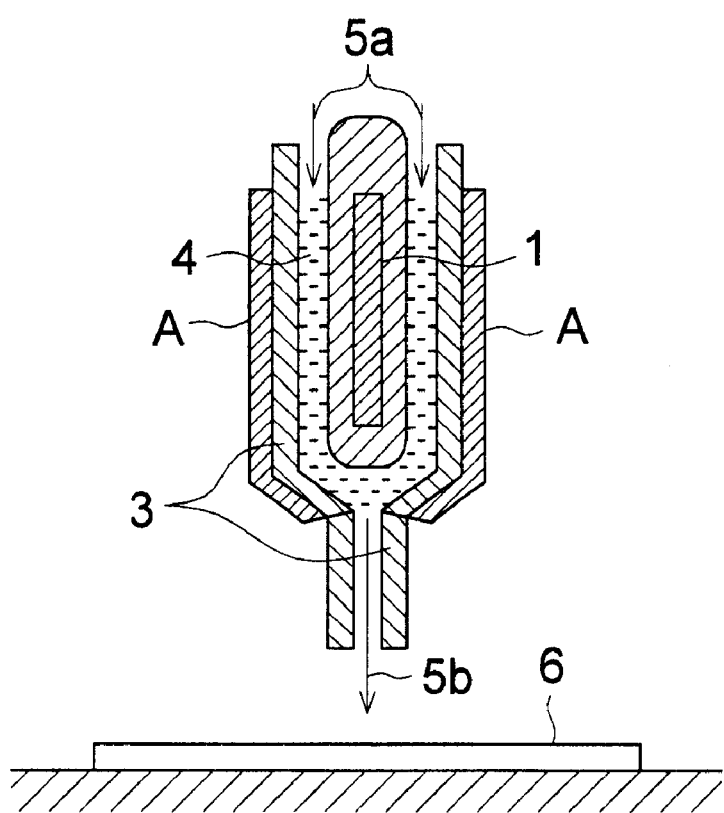
FIG. 3 is a drawing showing an example of the embodiment of a device for discharge treatment of a torch type for use in a method of surface treatment of this invention.
Figure 4:
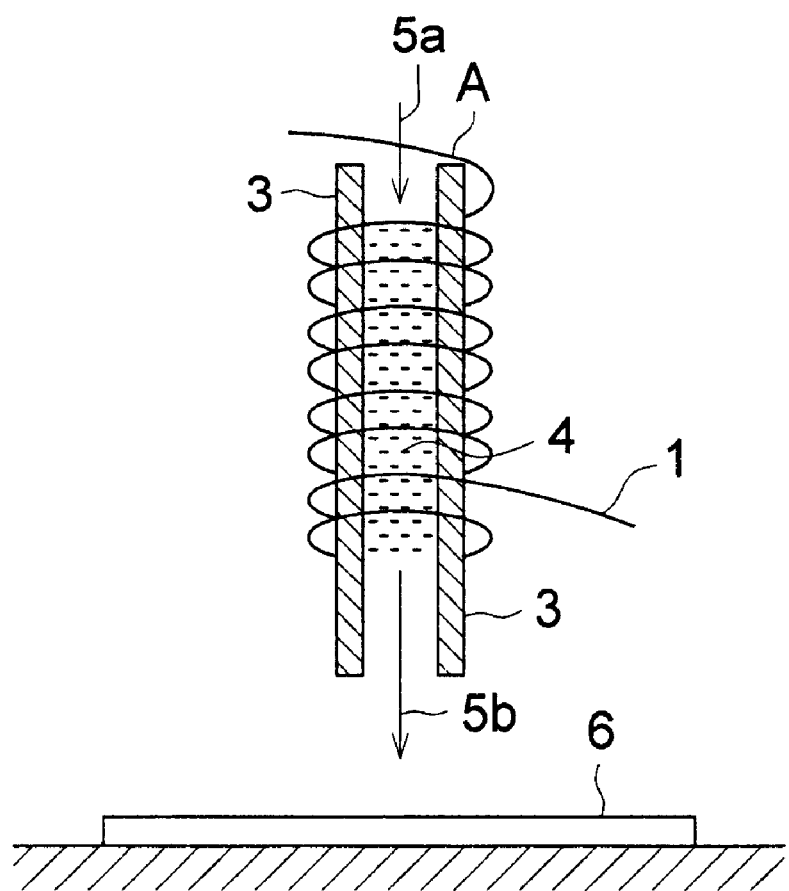
FIG. 4 is a drawing showing an example of the embodiment of a device for discharge treatment having a high-voltage electrode and a grounded electrode facing each other, each of which is arranged in a helical manner, for use in a method of surface treatment of this invention.

For an example of the configuration of the high-voltage electrode 1 and the grounded electrode A having a dielectric substance coated on the surface or arranged opposite to it for each of them, for example, a planar parallel-plate type as shown in FIG. 1, a band type as shown in FIG. 2, a torch type as shown in FIG. 3, and a helical type as shown in FIG. 4. can be cited.

In each of FIG. 1 to FIG. 4, an electric current is let to flow from the high-voltage electrode 1 having the dielectric substance 3 to the grounded electrode A having the dielectric substance 3, and an electric current is let to flow through the dischargeable gas which has been introduced from the gas inlet opening 5a, to generate the discharge-activated gas 4 (excited active species, for example, radicals, ions, a plasma, etc. are included); thus, by letting the discharge-activated gas 4 blow out to the direction of the blowing-out opening 5b, the surface treatment of a subject of treating 6 is carried out. In this case, also it is possible to apply a treatment for making the surface hydrophilic, or on the contrary, to apply a treatment for making the surface hydrophobic, in accordance with the kind of the dischargeable gas and the condition of discharge. Further, it is possible to apply a treatment for making the surface of the subject of treating rough.

Further, by introducing a reactive gas including a specified raw material into the discharge-activated gas, it becomes possible to form a thin film of the surface of a subject of treating. For the thin film, for example, a $SiO_2$ film, a $TiO_2$ film, etc. can be cited.

Any one of the electrodes shown in FIG. 1 to FIG. 4 described in the above can be used desirably in this invention, but this invention is not limited to these.

From the view point to obtain the effects described in the specification of this invention more desirably, it is desirable that the distance between the above-mentioned high-voltage electrode and the grounded electrode A is 20 mm or under, more desirably it should be 10 mm or under, and in particular, further more desirably it should be 7 mm or under.

In this invention, discharge treatment is carried out in an atmospheric pressure or in a pressure in the neighborhood of it. Here, an atmospheric pressure or a pressure in the neighborhood of it means a pressure in the range centered around $1.013 \times 10^2$ kPa. For example, it falls within a range of $1.013 \times 10^2 \pm 0.507 \times 10^2$ kPa, desirably within a range of $1.013 \times 10^2$ kPa $\pm 0.304 \times 10^2$ kPa, and more desirably within a range of $1.013 \times 10^2$ kPa $\pm 0.203 \times 10^2$ kPa.

When a discharge is induced at a specified intensity for a material which is being carried under an atmospheric pressure between a pair of electrodes, discharge similar to a glow discharge which occurs in vacuum is brought about, to generate a discharge-activated gas including excited active species (a plasma, radicals, ions, etc. are included). By such excited active species as described in the above, the surface of a subject of treating is treated.

Further, the electric discharge intensity in a plasma treatment through discharging in a gas is desirably not smaller than 50 W·min/m$^2$ and not greater than 500 W·min/m$^2$ in order to perform a stable and effective treatment without producing an arc discharge. By carrying out a plasma treatment through discharging in a gas in this intensity range, the treatment can be finished with uniformity and no damage. Further, the frequency of the alternate current at the time of treatment is adjusted to fall within a range of 500 Hz to several hundreds MHz, and the surface to be treated by the excited active species faces toward the anode of the electrodes; in this case, the frequency of the alternate current should desirably fall within a range of 500 Hz to several hundreds MHz, more desirably within a range of 1 kHz to 60 MHz, and in particular, further more desirably within a range of 3 kHz to 13.56 MHz.

Further, for the waveform of these applied voltages (voltage waveform), a sine wave is desirable, but of course, also a pulse waveform repeating voltage application/no application is effective; in particular, in the case where the subject of treating is weak against heat and heat generation by plasma should not be increased so much, to make the waveform a pulse is effective. However, because lowering of efficiency is produced by the ratio of plasma generation being lowered, in the case where there is no thermal problem, it is more desirable that the ON/OFF ratio (duty ratio) of voltage application/no application is large.

In the case where more efficient treatment (short-time treatment) is desired, it is effective to increase the output within a range where the durability of the dielectric substance of the electrodes can be secured, and it is appropriate to practice means such as raising the applied voltage or raising the dielectric constant ($\in$) of the dielectric substance. Further, increasing the output is accompanied simultaneously by heat generation, a dielectric substance having a high thermal conductivity is desirable.

From the above-mentioned view point, for example, white alumina is very effective owing to its high dielectric constant and high thermal conductivity.

A gas for use in discharge of this invention will be explained.

In respect of the gas for use in discharge of this invention, the conditions for the gas can be freely determined in accordance with the treatment desired; however, it is desirable, in order to keep discharge uniform and to generate a discharge-activated gas stably, to make a rare gas such as an argon gas or a helium gas, that is, an inactive gas, the main component (herein, a main component is defined as a component included by volume 50% or over of the total); as a criterion, it is desirable to make the 80% or over of the total an inactive gas (or inactive gases).

For the desired treatment described in the above, for example, a treatment to make a surface hydrophilic, a treatment to make a surface hydrophobic, etc. can be cited. In this invention, in the case where a treatment to make a surface hydrophilic is aimed at, it is desirable to use oxygen, nitrogen, carbon dioxide, water, alcohol, ketone, or the like mixed with the above-mentioned inactive gas. Further, in the case where a treatment to make a surface hydrophobic is aimed at, a fluorine-contained low molecular gas (for example, tetrafluoromethane, hexafluoropropylene, etc.), a low molecular hydrocarbon gas (for example, methane, ethane, ethylene, acetylene, etc.), etc. can be utilized.

Further, in the case where it is desired to form a polymerized film on the surface of a subject of treating by using a discharge-activated gas generated by the current made to flow through a dischargeable gas, a hydrocarbon gas capable of being polymerized, a fluorine-contained gas capable of being polymerized, an organic monomer gas, etc., and further, a polymerizable monomer which is liquid at the normal temperature bubbled by introducing a carrier gas can be utilized.

[THE EMBODIMENT OF THE INVENTION]

In the following, with the device for discharge treatment shown in FIG. 1 taken for instance out of the device for discharge treatment (also called a device for generating a discharge-activated gas) for use in this invention shown in FIG. 1 to FIG. 4 described in the above, by using FIG. 5, FIG. 6, FIG. 7, and FIG. 8, how to practice a method of surface treatment of this invention will be explained in detail.

Figure 5:
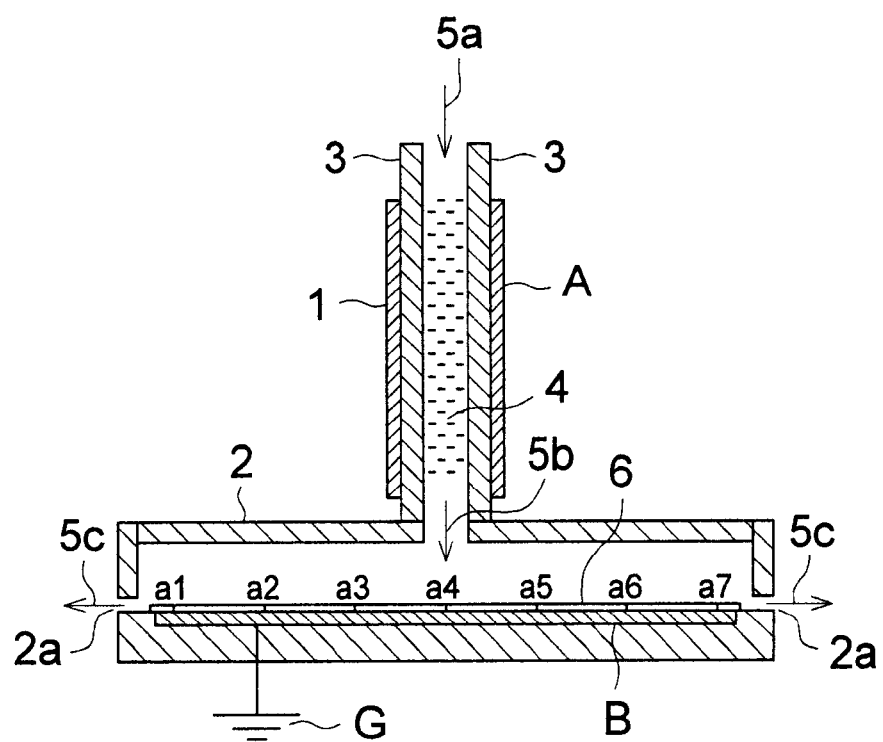
FIG. 5 is a drawing showing an example of the embodiment practicing a method of surface treatment of this invention.
Figure 6:
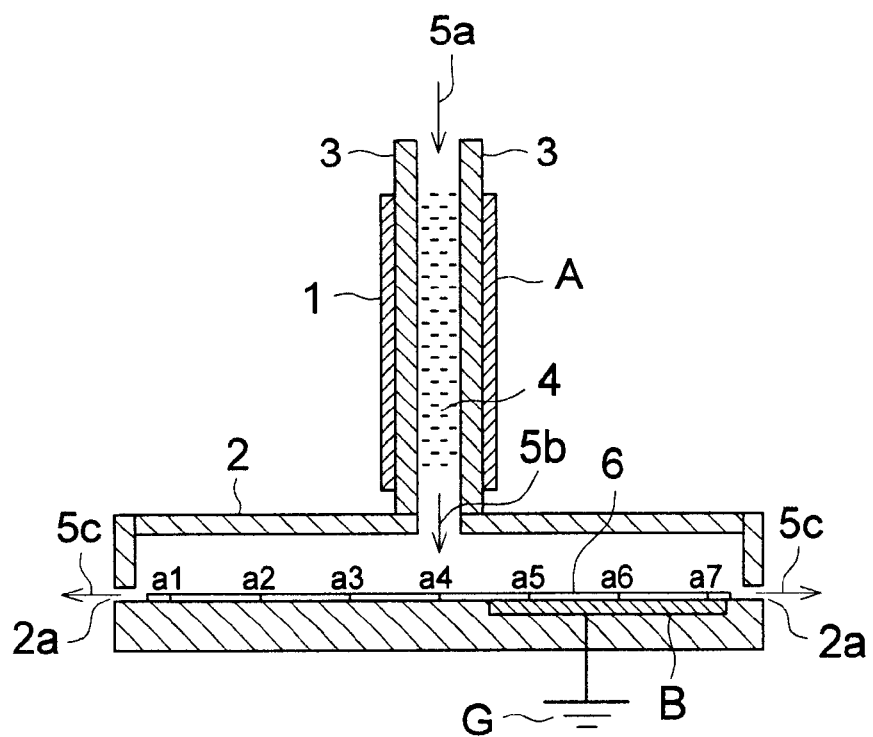
FIG. 6 is a drawing showing another example of the embodiment practicing a method of surface treatment of this invention.

Each of FIG. 5 and FIG. 6 shows an example of the embodiment of a method of surface treatment of this invention using a device for discharge treatment of a parallel-plate type shown in FIG. 1. In FIG. 5, the device for discharging treatment of a parallel-plate type shown in FIG. 1 and a reaction vat 2 are coupled, and the discharge-activated gas 4, which has been blown out to the direction of the gas blowing-out opening 5b, carries out the surface treatment for a subject of treating 6 which is placed in the reaction vat 2, and after that, it is ejected from the gas-ejecting opening 2a provided in the reaction vat 2. In this case, the biggest feature of this invention is that the subject of treating 6 is subjected to the surface treatment as it is kept in a state of direct contact with the grounded electrode B.

In a conventional method of surface treatment not using a grounded electrode B, there has been a tendency that points a3 to a5 on the surface of the subject of treating which are positioned near to the blowing-out opening of the discharge-activated gas 4 can be subjected to a good treatment, but points a1, a2, a6, and a7 which are positioned apart from said blowing-out opening cannot be subjected to a sufficient surface treatment; however, by using a method of surface treatment of this invention, it has become possible that all the points a1 to a7 are subjected to a uniform surface treatment without producing unevenness.

Also in FIG. 6, a surface treatment similar to that shown in FIG. 5 is performed, but the biggest difference from that shown in FIG. 5 is that, in FIG. 5, approximately 100% of the surface of the subject of treating 6 opposite to the surface to be treated by the discharge-activated gas 4 is kept in contact with the grounded electrode B, but in FIG. 6, the grounded electrode B is arranged in such a way as to cover only a part of the surface of the subject of treating 6 opposite to the surface to be treated.

The grounded electrode B in FIG. 6 is arranged at the opposite side to the points a4 to a7 on the front surface of the subject of treating 6. In this case, by using a method of surface treatment of this invention, it has become possible to selectively carry out the surface treatment in such a way that only the area over the points a4 to a7 is selectively subjected to the surface treatment, and the area over the points a1 to a4 at the rear side of which no grounded electrode B is arranged is kept in nearly untreated state.

Figure 7:
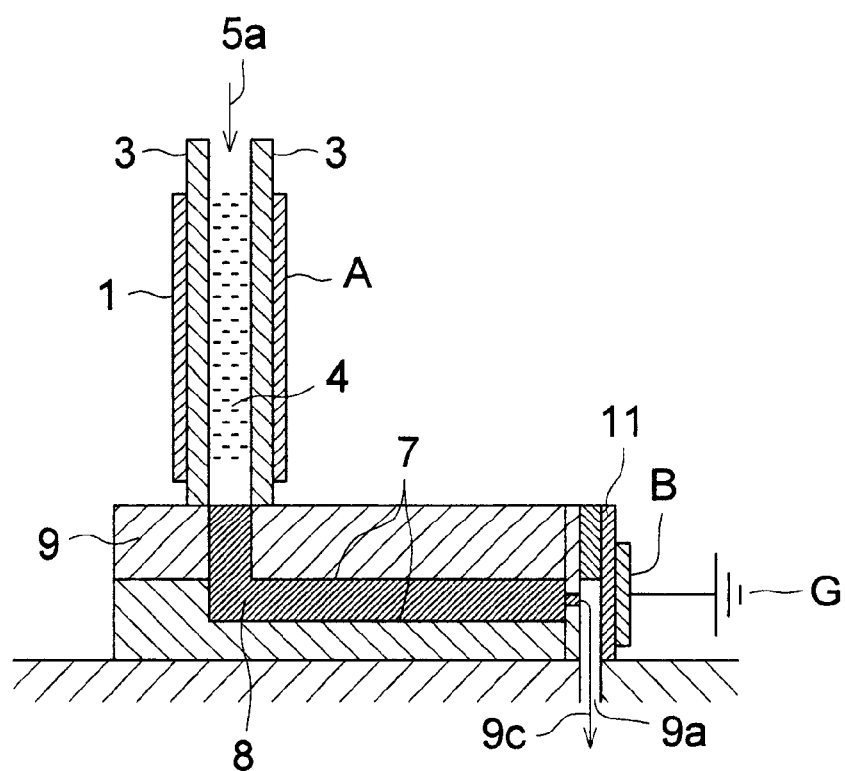
FIG. 7 is a drawing showing an example of the embodiment applying a method of surface treatment to a head for use in an ink jet printer.
Figure 8:
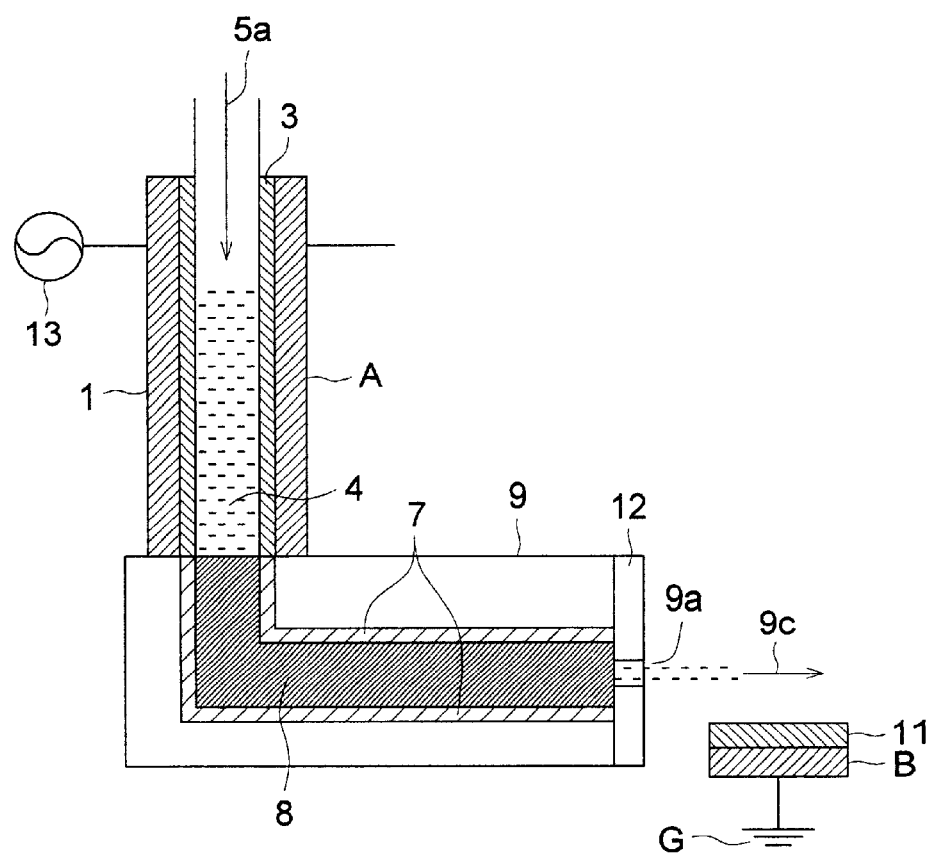
FIG. 8 is a drawing showing another example of the embodiment applying a method of surface treatment to a head for use in an ink jet printer.

Each of FIG. 7 and FIG. 8 shows an example of the embodiment performing a surface treatment (a treatment to make a surface hydrophilic, in this case) for an ink-flowing path provided inside a head for use in an ink jet printer by using a method of surface treatment of this invention.

In FIG. 7, by using a device for discharge treatment of a parallel-plate type as shown in FIG. 1 provided over a subject of treating 9 (to state it concretely, it represents a piezoelectric ceramic composing an ink-jetting head), the discharge-activated gas 4 generated is introduced into the ink-flowing path 8, to carry out a surface treatment for the preventive film 7, which is coated on the inner side of the ink-flowing path 8 or arranged in it, and is ejected from the gas-ejecting opening 9a provided at the end of the ink-flowing path, further passing through the gas-ejecting path 9c.

In this case, the grounded electrode B is kept in indirect contact with the subject of treating 9 through the dielectric substance 11. From the view point to desirably obtain the effects described in the specification of this invention, it is preferred that, as shown in FIG. 7, the grounded electrode B is kept in indirect contact with the subject of treating 9 through the dielectric substance 11 to that it is kept in direct contact with the subject, because a damage etc. of the preventive film 7 owing to charge-up or the like is reduced.

In FIG. 8, it is the same as FIG. 7, the basic structure such as a device for discharge treatment comprising a high-voltage electrode 1 and a grounded electrode A opposite to the high-voltage electrode 1, the arrangement of a subject of treating 9, an ink-flowing path 8 inside, and the structure of a preventive film 7 provided inside said ink-flowing path 8.

The difference in the structure shown in FIG. 8 from that shown in FIG. 7 is that the grounded electrode B is arranged along a gas ejecting path 9c of the discharge-activated gas 4 which has been ejected from a gas ejecting opening 9a provided in a dielectric substance 12, and the point of a big difference is that the grounded electrode B is spatially separated from the subject of treating 9.

From the explanation described in the above, it has been understood that, by applying a method of surface treatment of this invention, it is possible to perform a uniform surface treatment without producing unevenness even onto the points which are positioned away from the blowing-out opening of the discharge-activated gas, which cannot be performed by merely plasma-treating the whole of a subject of treating placed inside a device for plasma discharge, and it is provided a method of surface treatment capable of performing a uniform surface treatment without producing unevenness also in respect of the inside of minute holes of a subject of treating having minute and complex internal spaces, and further, because a treatment for making the surface of the ink-flowing path hydrophilic is performed uniformly without producing unevenness from the entrance to the inside, a head for use in an ink jet printer produced by using the method exhibits an extremely satisfactory performance in respect of bubble ejection capability (substitution by ink) in the ink-flowing path. Further, because a method of surface treatment of this invention is capable of practicing a surface treatment uniformly without producing unevenness within a short time, it is understood that this method is excellent from the view point of improving the productivity.

An Example of Practice

In the following, this invention will be explained on the basis of an example of practice, but this invention is not limited to this example.

EXAMPLE OF PRACTICE 1

(PREPARATION OF A SAMPLE FOR A SURFACE TREATMENT)

For the device for discharge treatment, a plasma device of a blowing-out type (a parallel-plate type) as shown in FIG. 1 was used; a high molecular film sample (polyethylene terephthalate) was set in a reaction container provided with an inlet opening for a discharge-activated gas and a gas-ejecting opening, the discharge-activated gas was blown to the surface of said high molecular film sample, to practice a treatment to make it hydrophilic; thus, a sample for comparison a was prepared. Next, a sample of surface treatment 1 was prepared in the same way except that the grounded electrode was arranged for the high molecular film sample in such a way as shown in FIG. 5.

Further, a sample of surface treatment 2 was prepared in the same way except that the grounded electrode was arranged in such a manner as to cover only a part of the rear side of the high molecular film sample as shown in FIG. 6.

In addition, when the grounded electrode was arranged in practicing surface treatment, it was done in such a way that the grounded electrode, which was subjected to a surface coating treatment with an insulator (Pyrex glass: thickness 0.5 mm) was arranged at the other side surface (representing the surface opposite to the surface to be exposed to the discharge-activated gas) of said high molecular film sample.

| | |
|---|---|
| Treatment condition: | Plasma jet device of a parallel-plate type |
| Electrode area: | 50 mm × 100 mm, |
| Discharge gap: | 2 mm |
| Dielectric substance (1 mm thick): | Alumina ceramic (dielectric constant ≅ 9–10) |
| Kind of gas and flow rate: | He (1 L/min) + $O_2$ (0.05 L/min) |
| Pressure in treating room (P): | 0.103 MPa |
| Discharge output: | 300 W/ |
| Applied voltage: | 6–7 kV/Power |
| Source frequency: | 5 kHz |
| Plasma treatment time: | 5 sec |

The result of the surface treatment using the device for discharge treatment described in the above was evaluated by 4 step ranking with respect to the degree of treatment to make the surface hydrophilic through measuring the contact angle of water as shown below. For the measurement of contact angles, DAT contact angle measuring instrument (manufactured by FIBLO Co., Ltd. (Sweden) was used.

The details of the evaluation ranks are as follows:

A: The effect of reforming is sufficient. (criterion: water contact angle 20° or under)

B: Considerable effect of reforming can be observed, with a little dispersion.

C: Although there is some effect of reforming, but not sufficient.

D: Effect of reforming can be hardly observed. (water contact angle exceed 60°.)

The results obtained are shown in Table 1.

TABLE 1

| Surface treatment sample | Arrangement of grounded electrode | Point on the subject of treating | | | | | | | Remarks |
|---|---|---|---|---|---|---|---|---|---|
| | | a1 | a2 | a3 | a4 | a5 | a6 | a7 | |
| 1 | Grounded electrode not used | D | D | C | B | C | D | D | comparison |
| 2 | Grounded electrode arranged over whole surface opposite to the surface to be treated of the subject of treating | B | B | A | A | A | B | B | Invention |
| 3 | Grounded electrode B is partially arranged, with no grounded electrode at the opposite side of points a1, a2, a3 | D | D | D | B | A | A | B | Invention |

From Table 1, it is clearly understood that, as compared to the sample for comparison (sample a) with no grounded electrode arranged, the sample of this invention 1 with the grounded electrode arranged at the opposite side of the points a1 to a7 exhibits a sufficient effect of reforming over the whole of a1 to a7. Further, for the sample of this invention 2, the treatment is performed in such a manner as to cause only the points a4 to a7 on the surface opposite to the side where the grounded electrode B is arranged to have a sufficient effect of reforming selectively, and the points a1 to a3 with no grounded electrode B arranged at their opposite side remain kept in a state of their being not substantially subjected to the surface treatment.

In the following, a surface treatment for a subject of treating having a minute vacant-space structure will be explained.

Figure 9:
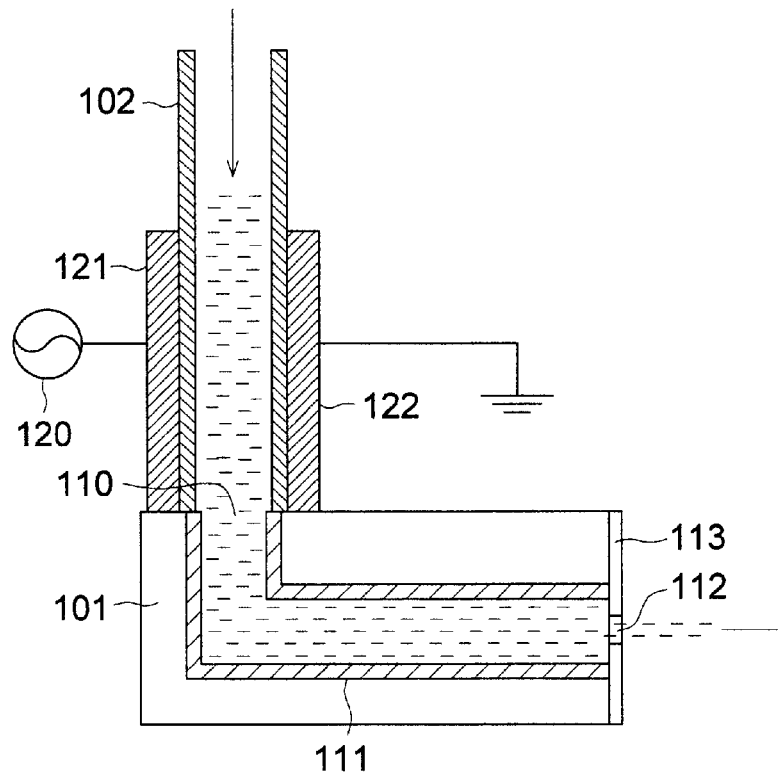
FIG. 9 is a drawing showing an example applying a conventional atmospheric plasma treatment to an ink-jetting head.
Figure 10:
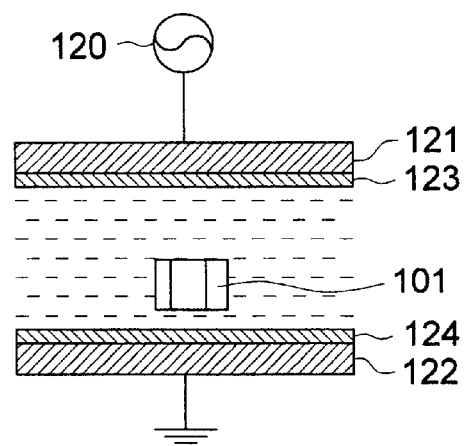
FIG. 10 is a drawing showing another example applying a conventional atmospheric plasma treatment to an ink-jetting head.

FIG. 9 and FIG. 10 are drawings showing examples applying a conventional plasma treatment in an atmospheric pressure to an ink-jetting head respectively. FIG. 9 shows an example in which, by letting a reaction gas pass between electrodes 121 and 122 to which an electric voltage is applied by a high frequency power source 120, said electrodes being arranged in such a manner as to face each other at the part of the tube for introducing a gas for use in discharge adjacent to the ink-flowing path (opening for introducing a reaction gas) of a subject of treating (an ink-jetting head in this case), the ink-flowing path, which is a through hole), is subjected to a plasma treatment by the discharge between the electrodes. In this case, it is considered that, because the excited active species generated between the two electrodes have not enough life to treat the inner surface of the ink-flowing path uniformly, the inner surface cannot be treated uniformly enough.

Further, FIG. 10 also shows a case where a subject of treating is placed in a conventional device for plasma treatment and is subjected to a plasma treatment in an atmospheric pressure; only two electrodes 121 and 122, dielectric substances 123 and 124 provided on the surface of the electrodes respectively, and a subject of treating 101 (an ink-jetting head in this case) are shown. For example, in the case of an ink-jetting head, it is an example practicing a treatment with discharging area of the electrodes made to be 75 mm×75 mm, and the distance between the electrodes kept at 5 mm. In this case, because excited active species cannot get into minute inner vacant spaces by a discharge in an atmospheric pressure, the surface of minute through holes such as an ink-flowing paths cannot be treated.

Further, even in the case where a plasma treatment is carried out in vacuum, where the inactivation of the excited active species is less (the lives of the excited species are longer than in an atmospheric pressure), it takes a considerable time to treat the surface inside the minute holes uniformly.

In order to treat the inner surface of minute vacant spaces (having a through hole) as in this invention, it is necessary to introduce a dischargeable gas at a high efficiency into the minute vacant spaces inside a subject of treating from an opening for introducing a dischargeable gas, and with respect to the device, it is necessary to attach closely a tube for introducing a dischargeable gas to said gas-introducing opening in order to introduce the dischargeable gas without leakage.

In order to apply a plasma treatment to the inner surface of minute vacant spaces (for example, narrow holes to function as ink-flowing paths of an ink-jetting head to be described later) with a good efficiency, it is desirable that a gradient of electric potential exists along the path from the gas-introducing opening of said narrow holes up to the ejection opening (along the direction of gas flowing accordingly).

It is the feature that a high frequency electric voltage is applied between the above-mentioned two electrodes which are arranged in the neighborhood of the opening for introducing a dischargeable gas and the opening for ejecting it respectively, a dischargeable gas is made to flow in this penetrating vacant-space structure, and plasma discharge is generated, to apply a surface treatment to the inner surface of said penetrating vacant-space structure.

In order to bring about a plasma discharge, the practical discharging gap spacing, that is, the distance between the two electrodes should be 50 mm or under. However, because enlarging the gap spacing is made possible by raising the electric voltage, the gap spacing is not necessarily limited; a desirable gap spacing is 20 mm or under between electrodes, and more desirable gap spacing is 10 mm or under.

That electrodes are positioned in the neighborhood of the opening for introducing a dischargeable gas and the opening for ejecting it respectively, means that the electrodes are arranged with a distance to make it possible to generate, without inducing a discharge along the outer surface, a necessary enough amount of excited active species caused by discharge to apply a sufficient treatment to the inner surface in said penetrating vacant-space structure, and it is within a range of 10 mm from the gas-introducing opening although it varies with the condition of plasma treatment, the form of the device for the treatment, etc. Further, in order to carry out the introduction of a gas with a good efficiency, usually an introducing tube is connected continuously to the gas-introducing opening, that is, it is a usual way to make the end of the gas-introducing tube the gas-introducing opening of the subject of treating. Hence, in this case, the electrode positioned at the side of introducing a dischargeable gas is arranged in the neighborhood of the gas-introducing opening (a position within 10 mm from it accordingly) and in such a manner as to be in contact with a part of the outer surface of the introducing tube. A desirable way is to put it on the outside of said introducing tube; it is appropriate that the electrode is either a metallic electrode with a dielectric substance provided on it or a direct metallic electrode, and in the case where the material to compose said introducing tube is a dielectric substance such as a glass, or a ceramic, the introducing tube itself plays also a role of the dielectric substance of the electrode.

The shape of the gas-introducing tube may be different in accordance with the shape and the number of the small holes needing the treatment, for example, in the case where there are a plurality of small holes to the inside of which the surface treatment is to be applied, it may be appropriate to make it have such a shape as to be capable of covering the whole of the gas-introducing openings of the plural small holes. Further, also it is appropriate to make it have such a shape as to be capable of covering a part of the openings. Hence, the cross-sectional shape is not limited to a circle, but an ellipsoid, a rectangle, etc. can be selected in accordance with the form of the subject of treating. For the material of the gas-introducing tube, any kind may be selected so long as it is easy to work and can be worked to become capable of being brought in close contact with the subject of treating; a metal, a glass, a ceramic, etc. are desirable. In the case of a metal, by providing a dielectric substance inside the gas-introducing opening of the tube, it is possible to use it also as a direct electrode. Basically, it is advantageous to use the same material as the dielectric substance provided on the electrode surface, because it can also function as the dielectric substance to be provided on the surface of the electrode at the introducing side as described in the above.

It becomes different in accordance with the condition such as the kinds of gas for use in discharge, what kind of surface treatment is applied; in the following, a method of practicing a treatment to make a surface hydrophilic for the inner surface of a small through hole to become an ink-flowing path of an ink-jetting head as well as several devices for practicing said method will be explained concretely.

The ink-jetting head is of a so called shear-mode type using a piezoelectric ceramic composed of lead zirconate-titanate etc. for example. An ink-jetting head sample prepared by the following procedures is used: On the above-mentioned piezoelectric ceramic substrate having a plurality of minute penetrating grooves (at intervals of 70 μm, for example) formed on it, aluminum electrodes are formed by evaporation coating, further grinding working is carried out to leave electrodes inside the grooves, a film composed of parylene is formed on this substrate by using a CVD method on the condition, for example, described in the publication of the unexamined patent application 2000-71451 as a preventive film for preventing the electrodes; further, a cover composed of lead zirconate-titanate is bonded by an epoxy adhesive, to form ink-flowing paths, and then, a nozzle plate composed of a polyimide resin etc. for example is provided on it to complete an ink-jetting head. Because the above-mentioned preventive film composed of parylene is highly hydrophobic, it is necessary to make hydrophilic the surface of the ink-flowing path covered with parylene, in order that the affinity to the ink which is hydrophilic may be improved to prevent bubbles entering inside the paths, and the ease of ejection of the bubbles may be improved to prevent them from remaining inside the ink-flowing paths.

A method of this invention can treat such a surface of minute penetrating vacant spaces to function as ink-flowing paths as mentioned above with a good efficiency.

With respect to an ink-jetting head, it is produced on the basis of the method described in the above-mentioned publication of the unexamined patent application 2000-71451. Concerning also a preventive film such as a parylene film, details are described in said specification, and further, in the publication of the unexamined patent application H10-250078 etc.

Figure 11:
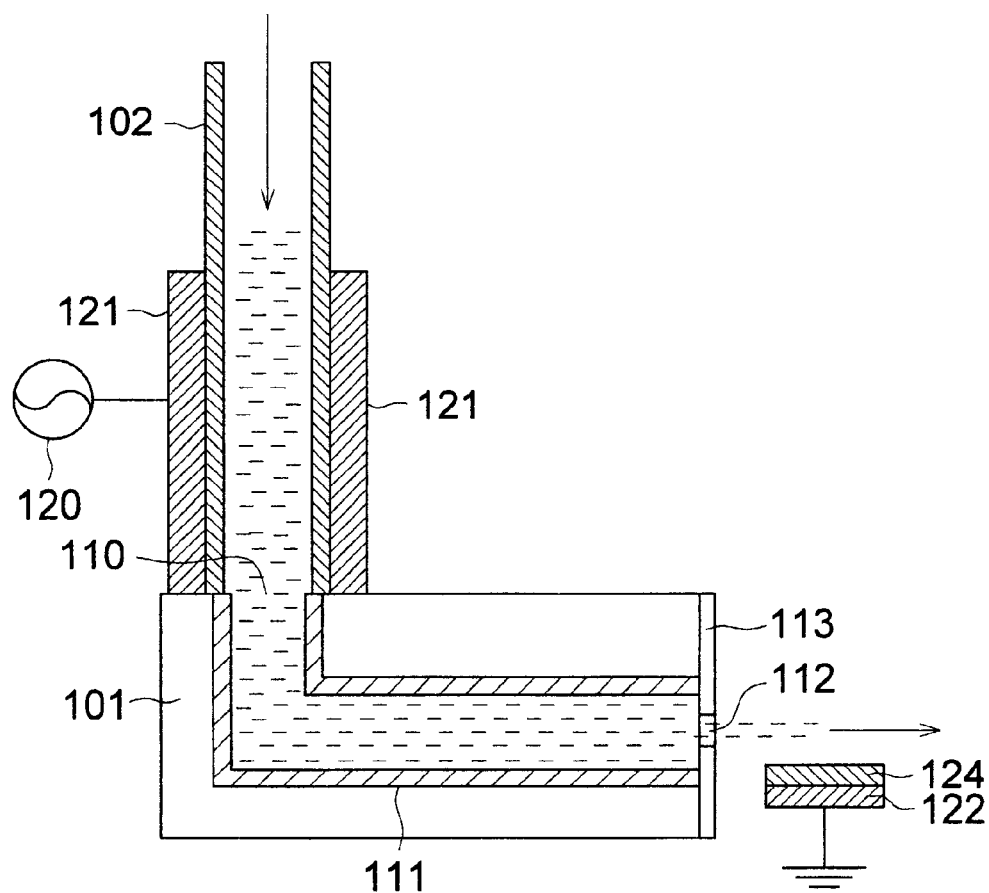
FIG. 11 is a drawing showing an example of the embodiment applying a plasma treatment of this invention to an ink-jetting head.

FIG. 11 shows an example of the embodiment applying a plasma treatment of this invention to an ink-jetting head. In FIG. 11, 101 denotes an ink-jetting head, a subject of treating, and a cross-sectional view along one of the plural ink-flowing paths which the ink-jetting head comprises is shown, and its inner surface is coated with an electrode preventing film (parylene film for example) 111. 102 denotes a tube for introducing a dischargeable gas, which is made of a dielectric substance such as a ceramic or a glass, and electrodes 121 are attached on its periphery in such a manner that said gas-introducing tube is kept in contact with the outside opening for introducing a dischargeable gas 110 of the ink-jetting head (in this case, the gas-introducing tube functions also as a dielectric substance on the surface of the electrodes, but in the case of some gas-introducing tube where such an effect cannot be obtained, it is preferred that a dielectric substance is separately provided on the surface of each electrode).

Further, also in the neighborhood of the nozzle plate 113, which is provided with the openings for ejecting a discharge-activated gas 112, an electrode 122 having a dielectric substance 124 on its surface is arranged and grounded.

For the purpose of a treatment for making a surface hydrophilic, for example, a gas for use in discharge such as an argon gas, or an oxygen gas is used, and the dischargeable gas is introduced through the gas-introducing tube 102 as shown by the arrow mark, into the ink-flowing path from the gas-introducing opening 110. A high-frequency electric voltage is applied from a high-frequency power source 120 to the electrode 121. An electric potential gradient is produced along the flow of a dischargeable gas in the ink-flowing path, and the gas generates excited active species in the ink-flowing path by plasma discharge, to make the surface of the preventive film hydrophilic in this case. By arranging electrodes in the close neighborhood of both the entrance of the ink-flowing path (the opening for introducing a discharge-able gas) of the ink-jetting head and the opening for ejecting a discharge-activated gas of the nozzle plate respectively, the inner surface of the ink-flowing path can be treated with a good efficiency.

Hence, according to a method of this invention, it can be practiced a surface treatment for the inside of a minute inner vacant space of a subject of treating having one or more of it, which cannot be performed by merely placing a subject of treating in the inside of a plasma discharge and applying a plasma treatment to the whole, and further, as compared to a vacuum plasma treatment, the treatment time can be remarkably shortened.

Figure 12:
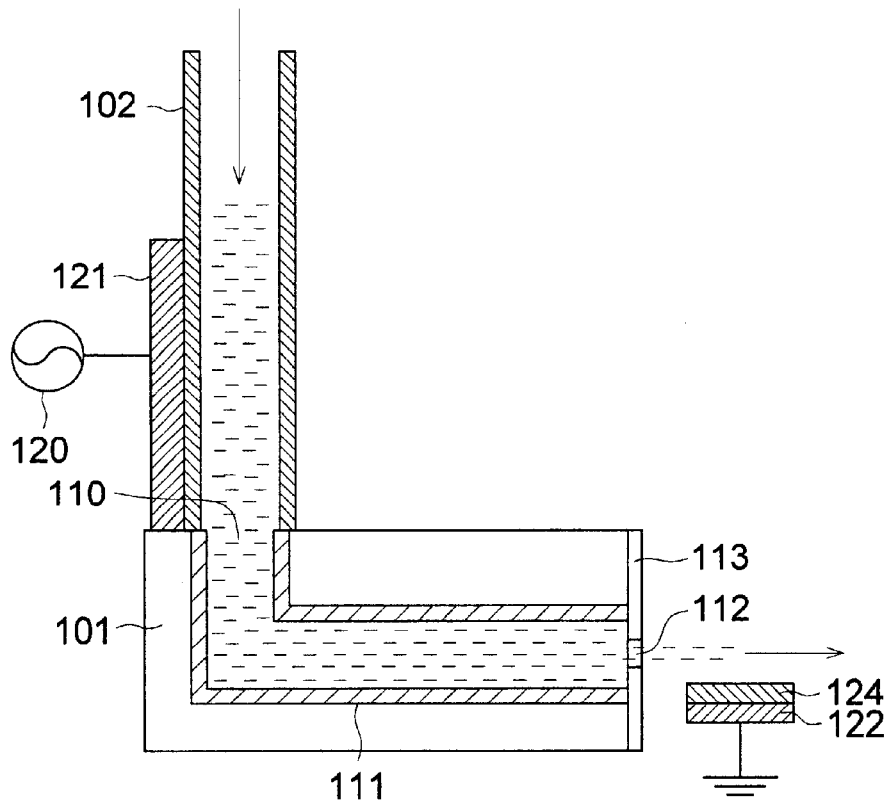
FIG. 12 is a drawing showing another example of the embodiment practicing a method of surface treatment of this invention.

FIG. 12 is a drawing showing another example of the embodiment practicing a method of surface treatment of this invention. In the example of FIG. 12, the electrode at the side of the opening for introducing a dischargeable gas 110 is arranged at the surface of a part of the outer periphery of the tube for introducing a dischargeable gas.

Figure 13:
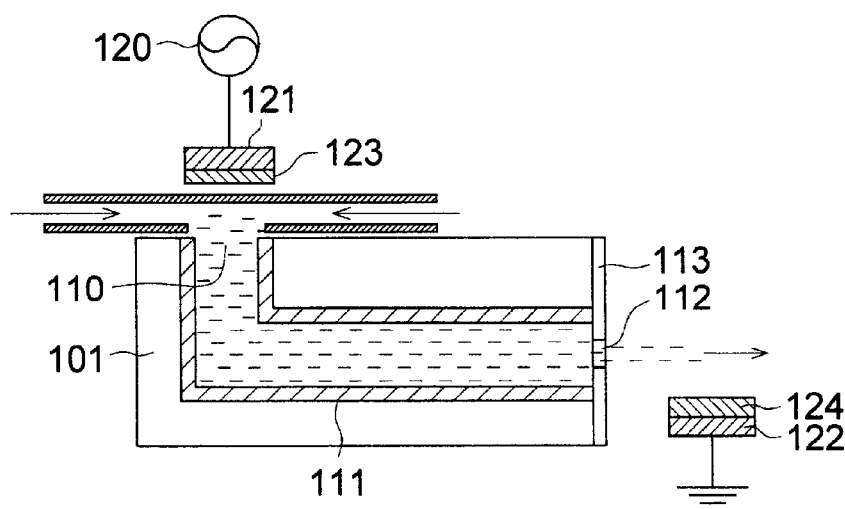
FIG. 13 is a drawing showing another example of the embodiment practicing a method of surface treatment of this invention, in which the electrode positioned at the gas-introducing side is arranged in such a manner as to face toward the gas-introducing opening.

FIG. 13 shows an example in which electrode 121 at the gas-introducing side having a dielectric substance 123 provided on the surface is arranged in such a manner as to be opposite to the openings for introducing a dischargeable gas 110 (the entrance of the minute through holes), and for that reason, the shape of the gas introducing tube is changed, to introduce a gas for reaction in such a way as shown by the arrow mark. The grounded electrode 122, the counter-electrode, at the side of the gas-ejecting opening 112 (provided with a dielectric substance 124 on the surface) is arranged parallel to the gas flow (shown by the arrow mark).

Figure 14:
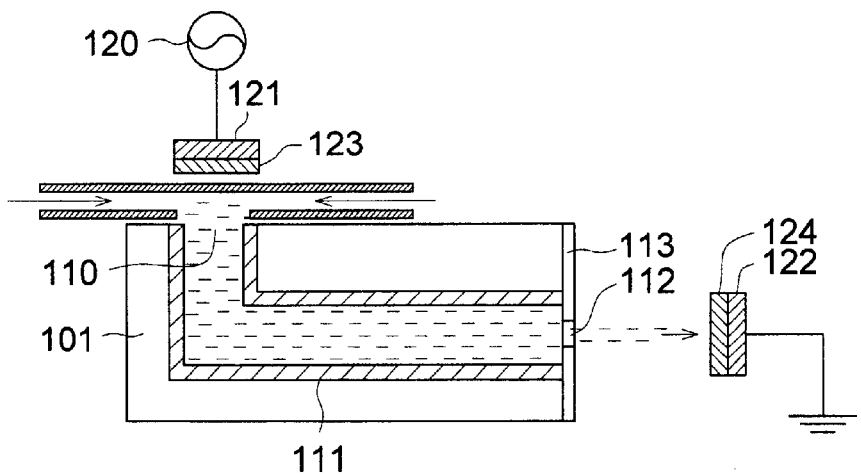
FIG. 14 is a drawing showing another example of the embodiment practicing a method of surface treatment of this invention, in which the electrode positioned at the gas-exhausting side is arranged in such a manner as to oppose the gas flow.

FIG. 14 shows an example in which the grounded electrode 122 at the side of the opening for ejecting a discharge-activated gas 112 (provided with a dielectric substance 124 on the surface) is further arranged in such a way as to face the gas flow.

The efficiency of discharge is raised in the case where an electrode is arranged in a configuration where it is positioned to cross the gas flow perpendicularly, but it is necessary to arrange it in such a manner as not to prevent the gas flow. In this case, for a position in the neighborhood of the nozzle plate where the electrode does not obstruct the flow and causes discharge to occur effectively, a distance of about 5 mm is suitable.

Figure 15:
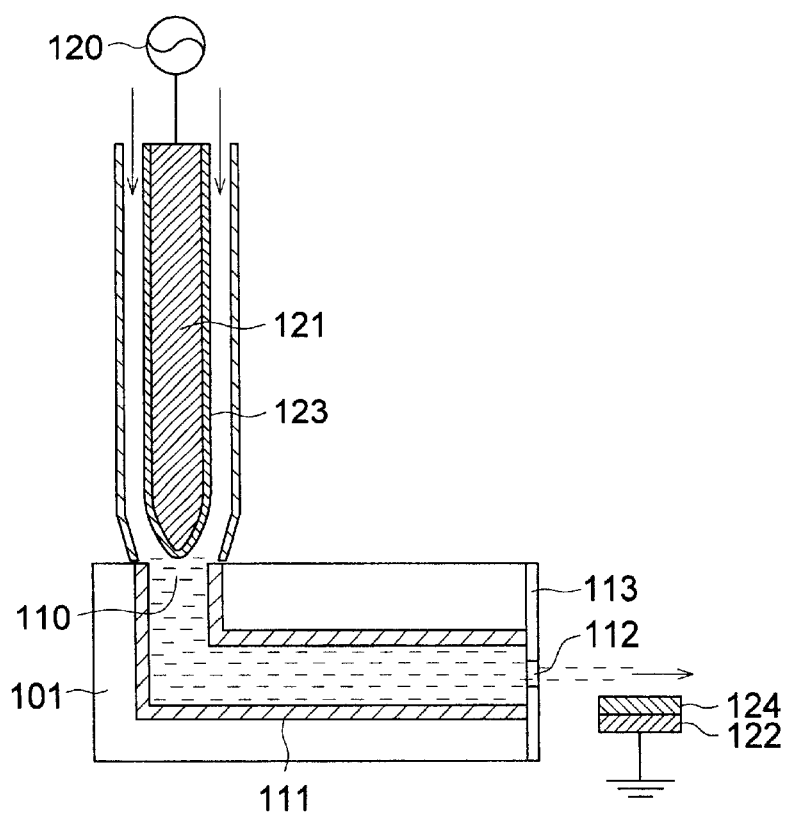
FIG. 15 is a drawing showing another example of the embodiment practicing a method of surface treatment of this invention, in which an electrode is arranged inside the gas-introducing tube.

FIG. 15 shows an example in which the electrodes having a dielectric substance provided on the surface are arranged inside the gas-introducing tube 102. The gas flow is shown by the arrow marks, and this example is desirable because the gas flow near the gas-introducing opening does not vary so extremely and flows smoothly. In this example, the electrode 122, the counter-electrode at the side of the ejecting opening for the flow of a discharge-activated gas, that is, at the exit side of the penetrating minute hole, is arranged with its surface positioned parallel to the gas flow at the gas-ejecting opening, but it is also possible to place it facing toward the flow.

Figure 16:
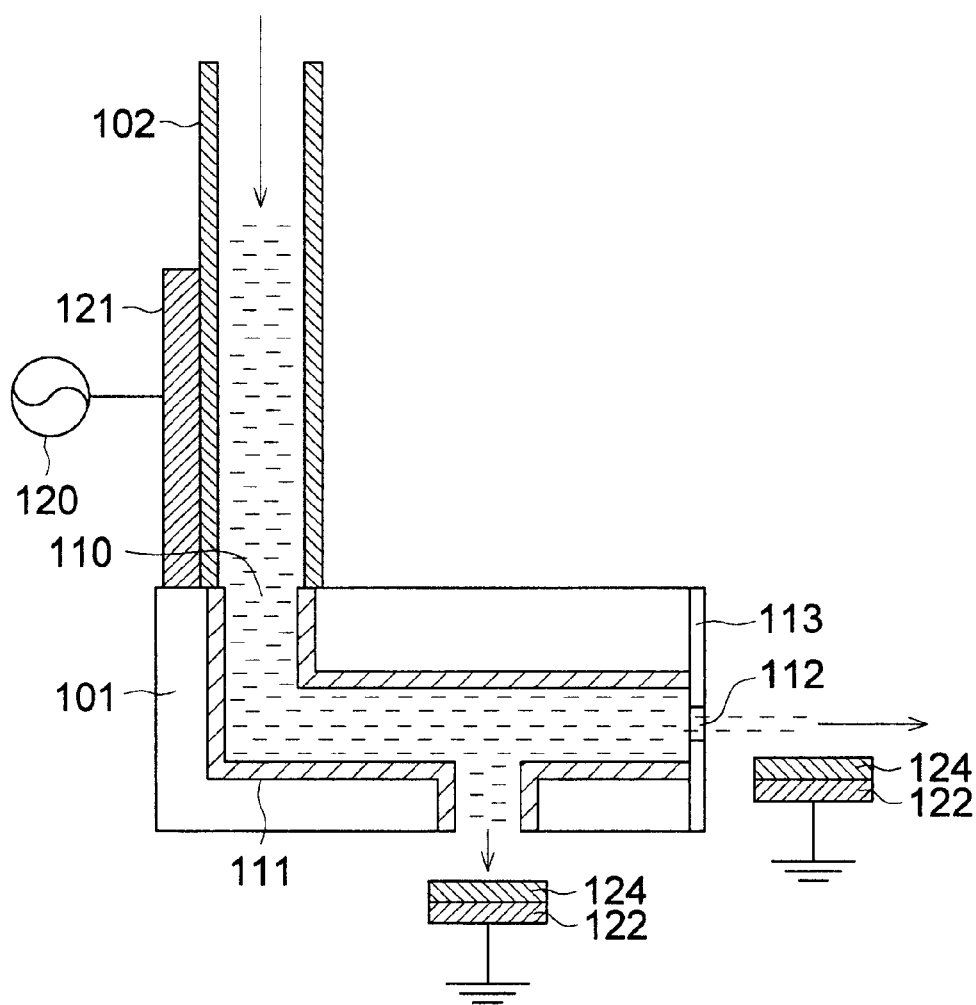
FIG. 16 is a drawing showing another example of the embodiment practicing a method of surface treatment of this invention, in which an electrode is arranged at each of the two exit sides.

FIG. 16 shows an example in which a subject of treating has a gas-introducing opening of penetrating small holes and has not only one gas-ejecting opening but also another gas-ejecting opening for each holes, and in this case also, by introducing a gas through a gas-introducing tube with an electrode attached, from the gas-introducing opening into the penetrating small holes, and arranging grounded electrodes as the counter-electrode respectively at the side of two exits, the surface of the inside leading to each of the gas-ejecting openings can be treated with a good efficiency. By placing one electrode only, also it becomes possible to treat the surface of the inside of one of the two small holes selectively.

Figure 17:
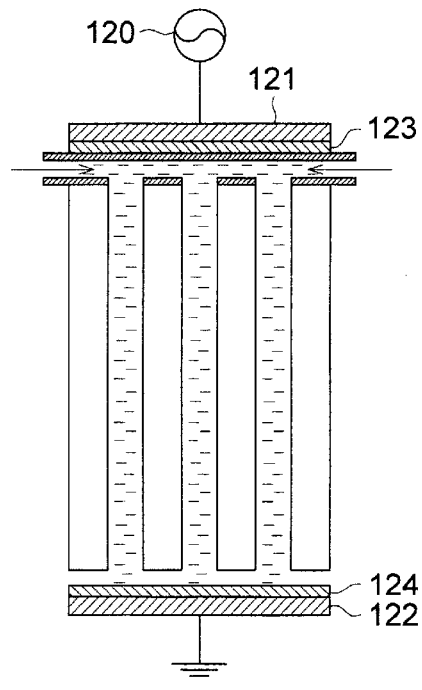
FIGS. 17(a), 17(b), 17(c) and 17(d) are drawings showing respective embodiments of treatment for ink-jetting heads having a plurality of minute through holes.
Figure 17:
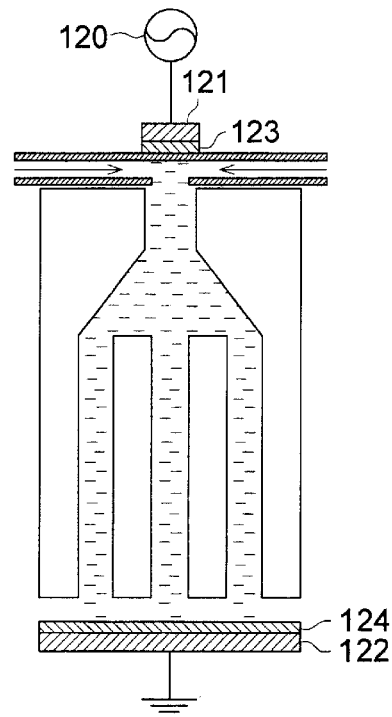
Figure 17:
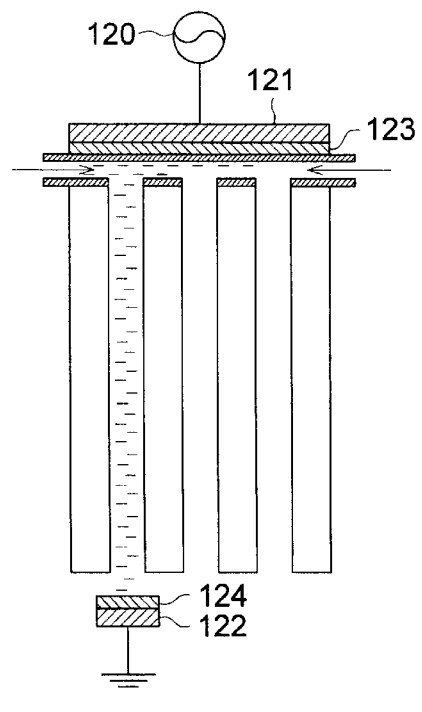
Figure 17:
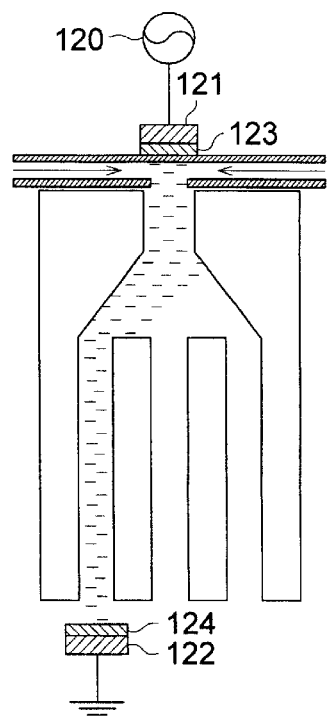

FIG. 17 is a drawing showing forms of treatment for an ink-jetting head having a plurality of minute through holes, and shows cross-sections along a plane including the center lines of the holes; it shows examples of how the inner surfaces of the ink-flowing paths are treated, by the plasma discharge of a gas introduced from the gas-introducing tube between the electrode 121 which has a dielectric substance 123 on its surface and is provided on the gas-introducing tube provided at the side of the openings for introducing a dischargeable gas, and the electrode 122 which has a dielectric substance 124 on its surface and is arranged in such a manner as to face the gas-ejecting openings. FIG. 17(a) and FIG. 17(c) show forms such that the whole of the plural gas-ejecting openings is covered by the counter-electrode, which makes it possible to treat the whole surface of the minute holes of the subject of treating. By arranging the counter-electrode at one of the plural gas-ejecting openings as shown in FIG. 17(b) and FIG. 17(d), the inner surface of the minute hole from the gas-introducing opening to the gas-ejecting opening where the counter-electrode is arranged is preferentially subjected to the surface treatment; therefore, a selective treatment for the inner surface of minute holes is possible.

In the following, conditions set for on subject of treating having minute vacant spaces will be explained.

It is desirable to make the frequency of an alternate current in carrying out the treatment fall in a range of 1 kHz to 60 MHz, and is more desirable to make it fall within a range of 3 kHz to 800 kHz. It is not so much desirable to make it under 1 kHz, because it makes a discharge difficult to occur, and in order to generate a discharge, a very high voltage such as several tens kV is required, which brings about the cost increase of the power source apparatus as well as the cost increase owing to the countermeasure against a surface creepage (discharge to be generated along the outer surface of a part other than said minute holes of a subject of treating). On the other hand, raising the frequency is very effective for making high the efficiency of a treatment because it makes possible the raising of the output at lower voltages; however, because the amount of generated heat at the time of exciting a plasma becomes very large, it is necessary to pay sufficient attention to the durability of the electrode and the dielectric substance of the electrode, and some means for cooling is essential. Further, in order to generate a discharge stably, it is necessary to make the discharge gap small. Hence, the above-mentioned range is comparably desirable for the frequency of a power source of this invention.

The magnitude of the voltage to be applied between the electrodes opposite to each other can be suitably determined; it is desirable that the strength of the electric field falls within a range of 1 to 100 kV/cm when the voltage is applied to the electrodes, and usually, the electric field strength (the gradient of electric potential) falls within a range of 4 to 40 kV/cm. If it is lower than 1 kV/cm, the treatment takes too long a time, and if it exceeds 100 kV/cm, arc discharge is easy to occur. Further, the stronger the electric field is, the higher the speed of treatment is; however, if it is too much raised, the substrate is damaged as described in the foregoing. Further, also it is appropriate to apply a pulse electric field with a direct current field superposed on it.

Further, for the waveform of these applied voltages, a sine waveform is desirable; however, it is of course effective a pulse wave which repeats voltage application/no application, and in particular, in the case where a subject of treating is weak against heat and it is desired not to raise the amount of generated heat of the plasma, to make the waveform a pulse is effective. However, because there is the lowering of efficiency owing to the ratio of plasma generation being lowered, in the case where there is no thermal problem, it is more desirable that the ratio of voltage application/no application (duty ratio) is large.

Further, in the case where a more efficient treatment (short-time treatment) is desired, it is effective to increase the output within a range where the durability of the dielectric substance of the electrodes can be secured, and it is appropriate to practice means such as raising the applied voltage or raising the dielectric constant (∈) of the dielectric substance. As described in the above, for the dielectric substance, one having a high dielectric constant and a high thermal conductivity is desirable.

In a surface treatment by plasma, it is determined by the plasma treatment conditions including the kinds of reactive gas, how the surface is to be reformed. Hence, the conditions of gases can be freely selected in accordance with the desired treatment to aim at. In order to generate a discharge uniformly and stably, it is desirable to make it the main component, a rare gas such as an argon gas or a helium gas, which is an inactive gas, and as a criterion, it is appropriate to make the 80% or over an inactive gas (or inactive gases).

In the case where a treatment for making a surface hydrophilic is aimed at, it is appropriate to mix oxygen, nitrogen, carbon dioxide, water, alcohol, ketones, etc., and in the case where a treatment for making a surface hydrophobic is aimed at, a fluorine-contained low molecular gas, a low molecular hydrocarbon gas, etc. can be utilized.

Further, in the case where it is desired to form a polymerized film, a hydrocarbon gas, a fluorine-contained gas, an organic monomer gas, etc., and in particular, a polymerizable monomer which is liquid at the normal temperature bubbled by introducing a carrier gas into it can be utilized.

A method of surface treatment of this invention is most effective particularly for a surface treatment for reforming a hydrocarbon high molecular material such as parylene to be used in a preventive film for use in manufacturing the ink-flowing paths of an ink-jetting head, but it is not limited to that and is effective also for an inorganic substance such as a ceramic or a metal. With respect to the other items than a treatment for making a surface hydrophilic using a plasma treatment for the inner surface of the ink-flowing paths, such as the structure of an ink-jetting head, and further, its manufacturing method itself, methods described in the publications of the unexamined patent applications H10-250078, 2000-71451, etc. can be used.

[AN EXAMPLE OF PRACTICE]

In the following, an example of the embodiment of this invention will be explained on the basis of a treatment for making hydrophilic the surface of ink-flowing paths of a head for use in an ink jet printer, but the mode of this invention is not to be limited to this.

Example 2

(Preparation of a sample for a treatment for making hydrophilic the surface of ink-flowing paths of a head for use in an ink jet printer)

(Preparation of sample 1)

On the basis of the description in the publication of the unexamined patent application 2000-71451, an ink-jetting head as described in FIG. 15 was produced. That is, it was produced a piezoelectric ceramic substrate composed of lead titanate-zirconate of an ink-jetting head having penetrating minute grooves to function as ink-flowing paths formed on it with a dicing saw in such a manner as described in the type I below.

| | |
|---|---|
| Type I: | intervals of 105 µm |
| Size of 1 flow path: | 105 µm × 420 µm × 7 mm (length) |
| Aperture diameter of nozzle plate: | 43 µm |
| Number of flow paths: | 64 |

Next, an aluminum electrode layer was formed on the piezoelectric substrate by evaporation coating, and grinding working was carried out, to leave electrodes inside the grooves. On this substrate and a piezoelectric element cover made of lead titanate-zirconate, an electrode preventing film composed of a parylene film 3 µm thick was formed by a CVD method by using Parylene C (obtained from Threebond Co., Ltd.), in order to coat to protect the electrodes and to keep an insulating property.

Further, after the cover composed of lead titanate-zirconate was bonded to the substrate by an epoxy adhesive to form ink paths, a nozzle plate made of a polyimide resin having apertures of diameter 43 µm was attached to make an ink-jetting head.

Because this parylene film is hydrophobic, the ink which is hydrophilic has a poor wettability to it, and the surface of the ink-flowing paths cannot be perfectly substituted by the ink as long as the parylene film is left as it is. Therefore, a treatment for making the surface hydrophilic was applied to it, and the surface of the parylene was made hydrophilic to improve the wettability of the ink; thus, the surface of the ink-flowing paths was made easy to be substituted by the ink.

It was intended to confirm the effect of this invention by the following procedures, which are applying a plasma treatment to the inner surface of the ink-flowing paths, by using a device for surface treatment composed of a gas-introducing device, which is composed of a tube for introducing a dischargeable gas, and electrodes having a dielectric substance provided on the surface arranged at the outside of said gas-introducing tube, and is arranged at the side of the openings for introducing a dischargeable gas of the ink-flowing paths, and a grounded electrode which has a dielectric substance provided on its surface and is arranged in such a manner as to face toward the gas-ejecting openings (the nozzle plate side) of the ink-flowing paths at a distance of 5 mm, and studying the effect of the treatment for making the surface hydrophilic and the influence of the treatment to the polarization characteristic (damage) of the piezoelectric ceramic. Besides, for the tube for introducing a dischargeable gas, it was used a Pyrex glass tube (1 mm thick), which was worked to a shape capable of covering all the 64 ink-flowing paths of the ink-jetting head sample, was provided with stainless steel electrodes at the opposite side of the gas-introducing opening, and was brought in close contact with the gas-introducing openings of the sample so as not to let a dischargeable gas leak out. The electrode functioning as a counter-electrode was also such one that Pyrex glass layer of thickness 1 mm was provided on the surface of a stainless steel material.

The conditions of the surface treatment (plasma treatment) were set as follows:

| | |
|---|---|
| (Power source): | 50 kHz high-frequency power source (manufactured by Shinko-Denki Co., Ltd.) |
| (Gas): | He; 0.95 L/min, Oxygen; 0.05 L/min |
| (Discharge condition): | Applied voltage 6 kV, Discharge output 800 W |
| (Dielectric substance of electrode): | Pyrex glass (1 mm thick) |
| (Environmental condition): | Near atmospheric pressure (101.32 ± 10.13 kPa), Temperature 25° C. |

On the other hand, in contrast with the preparation of the sample 1, a sample 2 was prepared on a condition where no grounded electrode was provided at the gas-ejecting opening side.

The confirmation of the effect of reforming (treatment for making the surface hydrophilic) of the ink-flowing paths was performed by 2 rank evaluation of no bubble and many bubbles, through supplying water to the ink-flowing paths and visually observing bubbles remaining on the inner wall of the ink-flowing paths under a microscope, because if the treatment is enough, no bubble remains, and if the treatment is not enough, bubbles remain attaching on the inner wall of the ink-flowing paths and in the neighborhood of the rear surface of the nozzle plate.

(BUBBLE EJECTING CAPABILITY)

The title means the ejecting capability of the surface for bubbles when water is injected into the inside of the channels. If the inside of the channels is not made hydrophilic enough, water cannot wet the whole wall surface by pushing away bubbles, and as the result, the bubbles remain inside the channels. As the result, the evaluation "many bubbles" is given.

As described in the above, the evaluation was done by filling the ink-flowing paths with pure water, which has a surface energy (72 mN/m) higher than that of the ink (generally 30 to 40 mN/m), and visually recognizing whether or not the inside of the flow paths are substituted completely by pure water through ejecting gas completely out of the inside of the ink-flowing paths (ejection of bubbles).

| Sample | Surface treatment condition (discharge treatment: yes or no) | Visual observation | Remarks |
|---|---|---|---|
| 3 | no plasma treatment | many bubbles | example for comparison |
| 2 | with plasma treat., no grounded electrode | many bubbles | example for comparison |
| 1 | with plasma treat., with grounded electrode | no bubble | this invention |

From the table shown above, it is clearly understood that, as compared to samples for comparison, for the sample of this invention, because the treatment to make the surface hydrophilic was performed without unevenness and uniformly, bubbles were reduced remarkably. Further, for the sample 2, the result shown in the above was obtained by carrying out the treatment for 300 sec (=5 min). In contrast with that, for the sample of this invention, the time required for the treatment was only 10 sec, which means that it has become possible to shorten the treatment time by a large margin.

By means of this invention, it has become possible to provide a method of surface treatment, a method of manufacturing a head for use in an ink jet printer using said method of surface treatment, a head for use in an ink jet printer, and a device for surface treatment, said method of surface treatment having made the following things possible: treating a subject of treating having a complex shape without unevenness, improving the efficiency of treatment by a large margin and shortening the treatment time or lowering the discharging output, and further, lowering the damage of the subject of treating by the treatment, and as the result, a remarkable improvement of productivity, to state it concretely, to make possible a high-speed treatment, cost reduction through energy saving and through reducing running cost, and a high-quality surface treatment.

Further, by means of the above-mentioned technology, the surface treatment of the inside of a complex shape and the inside of a minute vacant space, which are extremely difficult to treat, is possible, and also the efficiency of treatment can be improved by a large margin. As the result of it, the improvement of productivity through shortening of the treatment time, energy saving by reducing the amount of used gas and the discharge output, etc., cost reduction by lowering the running cost, and a stable processing have become possible; therefore, a high-quality stable production has become possible.

Disclosed embodiments can be varied by a skilled person without departing from the spirit and scope of the invention.

What is claimed is:

1. A method for treating a surface of a subject to be processed under a surface treatment with a discharge-activated gas, comprising the steps of:
   generating said discharge-activated gas under substantially an atmospheric pressure at a discharging section, which comprises a first electrode coated with a first dielectric substance;
   placing said surface of said subject between an outlet of said discharging section and a second electrode disposed at a position separating from said discharging section; and
   treating said surface of said subject with said discharge-activated gas flowing from said outlet of said discharging section;
   wherein said discharging section further comprises a third electrode disposed opposite said first electrode.

2. The method of claim 1,
   wherein said second electrode is grounded.

3. The method of claim 1,
   wherein a second dielectric substance is either coated or placed on a surface of said second electrode.

4. The method of claim 1,
   wherein said surface of said subject is coated with a high polymer material.

5. The method of claim 1,
   wherein said second electrode is disposed at such a position that said subject contacts said second electrode either directly or indirectly.

6. The method of claim 1,
   wherein said second electrode is disposed in such a direction that said discharge-activated gas flows after said surface of said subject is treated.

7. The method of claim 1,
   wherein an electronic potential gradient is created along a flowing direction of said discharge-activated gas.

8. The method of claim 1,
   wherein said discharge-activated gas includes either a helium gas or an argon gas.

9. The method of claim 1,
   wherein said subject comprises at least two openings including a first opening and a second opening, and said discharging section is set at said first opening, while said second electrode is set at said second opening.

10. The method of claim 9,
    wherein an interior surface of said subject is processed under said surface treatment.

11. The method of claim 10,
    wherein said subject is an ink-jetting head, and said interior surface is a surface of an ink-flowing path fabricated in said ink-jetting head.

12. The method of claim 11,
    wherein said ink-jetting head comprises a piezoelectric element.

13. The method of claim 11,
    wherein said interior surface of said subject is treated by said discharge-activated gas so as to make said interior surface hydrophilic.

14. The method of claim 9,
    wherein said first opening is an intake section of said discharge-activated gas, and said second electrode is an exhaust section of said discharge-activated gas.

15. The method of claim 1,
    wherein discharging actions is performed in a gap between said first electrode and said third electrode and a distance between them is not greater than 50 mm.

16. The method of claim 1,
    wherein said surface of said subject is treated by said discharge-activated gas so as to make said surface hydrophilic.

17. The method of claim 1,
    wherein said surface of said subject is treated by said discharge-activated gas so as to form a thin film layer on said surface.

18. The method of claim 1,
wherein said surface of said subject is treated by said discharge-activated gas so as to make said surface hydrophobic.

19. The method of claim 1,
wherein said surface of said subject is treated by said discharge-activated gas so as to make said surface coarse.

20. A method for treating a surface of a subject to be processed under a surface treatment with a discharge-activated gas comprising the steps of:
generating said discharge-activated gas under substantially an atmospheric pressure at a discharging section, which comprises a first electrode coated with a first dielectric substance;
placing said surface of said subject between an outlet of said discharging section and a second electrode disposed at a position separating from said discharging section; and
treating said surface of said subject with said discharge-activated gas flowing from said outlet of said discharging section;
wherein said generating step further comprises the steps of:
introducing a dischargeable gas into a discharging space of said discharging section from an inlet located at a side of said discharging section;
applying an electronic potential onto said first electrode so that said discharge-activated gas is generated by discharging actions performed in said discharging space filled with said dischargeable gas; and
gushing said discharge-activated gas from said outlet located another side of said discharging section through said discharging space.

21. A method for treating a surface of a subject to be processed under a surface treatment with a discharge-activated gas, comprising the steps of:
generating said discharge-activated gas under substantially an atmospheric pressure at a discharging section, which comprises a first electrode coated with a first dielectric substance;
placing said surface of said subject between an outlet of said discharging section and a second electrode disposed at a position separating from said discharging section; and
treating said surface of said subject with said discharge-activated gas flowing from said outlet of said discharging section;
wherein said subject comprises at least two openings including a first opening and a second opening, and said discharging section is set at said first opening, while said second electrode is set at said second opening; and
wherein said first electrode is disposed at such a position that said first electrode contacts at least a part of an outer surface of a dischargeable-gas intake tube.

22. An ink-jetting head employed for an ink-jet printer, comprising:
a base body; and
an ink-flowing path formed in said base body;
wherein an interior surface of said ink-flowing path is treated so as to make said interior surface hydrophilic, according to a method for treating said interior surface with a discharge-activated gas, comprising the steps of:
generating said discharge-activated gas under substantially an atmospheric pressure at a discharging section, which comprises a first electrode coated with a first dielectric substance;
placing said interior surface between an outlet of said discharging section and a second electrode disposed at a position separating from said discharging section; and treating said interior surface with said discharge-activated gas flowing from said outlet of said discharging section; and
wherein said discharging section further comprises a third electrode disposed opposite said first electrode.

23. An apparatus for treating a surface of a subject to be processed under a surface treatment with a discharge-activated gas, comprising:
a discharging section, having a first electrode coated with a first dielectric substance, to generate said discharge-activated gas; and
a second electrode, disposed at a position separating activated gas along an electronic potential gradient created by said second electrode;
wherein said discharging section further comprises a third electrode disposed opposite said first electrode.

* * * * *